(12) United States Patent
Levi et al.

(10) Patent No.: US 7,620,770 B2
(45) Date of Patent: Nov. 17, 2009

(54) DEVICE AND METHOD FOR STORING AND PROCESSING DATA UNITS

(75) Inventors: David Levi, Shoham (IL); Yoram Gross, Nes Ziona (IL)

(73) Assignee: Ethernity Networks Ltd., Lod (IL)

( * ) Notice: Subject to any disclaimer, the term of this patent is extended or adjusted under 35 U.S.C. 154(b) by 503 days.

(21) Appl. No.: 11/558,378

(22) Filed: Nov. 9, 2006

(65) Prior Publication Data
US 2008/0114926 A1 May 15, 2008

(51) Int. Cl.
*G06F 13/00* (2006.01)
(52) U.S. Cl. ........................ 711/105; 709/238
(58) Field of Classification Search .............. 711/105; 709/238
See application file for complete search history.

(56) References Cited
U.S. PATENT DOCUMENTS
2006/0143410 A1* 6/2006 Chen et al. ............. 711/149
2006/0221945 A1* 10/2006 Chin et al. .............. 370/381
2006/0294322 A1* 12/2006 Matsuzaki et al. ......... 711/149
2007/0266179 A1* 11/2007 Chavan et al. ............ 709/250

* cited by examiner

*Primary Examiner*—Brian R Peugh
*Assistant Examiner*—Jared I Rutz
(74) *Attorney, Agent, or Firm*—Pearl Cohen Zedek Latzer LLP

(57) ABSTRACT

A device and method for storing and processing data units. The method includes: storing, at a read request dual port random access (DPR) memory unit, at least one request to read data from a double data rate (DDR) memory unit; storing, at a write request dual port random access (DPR) memory unit, at least one request to write data to a double data rate (DDR) memory unit; selecting a stored request to be sent to the DDR memory unit; wherein if the selected stored request is a write request, storing an ingress data unit at the DDR memory unit; and retrieving a fetched data unit from the DDR memory unit and processing the fetched data unit to provide an egress data unit; wherein the fetched data unit comprises at least a portion of the ingress data unit.

26 Claims, 3 Drawing Sheets

100

DEVICE AND METHOD FOR STORING AND PROCESSING DATA UNITS

FIELD OF THE INVENTION

The invention relates to methods and devices for storing data units and especially a switch that stores data units in a double data rate (DDR) memory unit.

BACKGROUND

Memory switches are commonly used in small to medium size devices. Ingress data units such as packets that arrive at the memory switch are classified, placed in queues in the memory, and eventually scheduled to be transmitted from their destination port. In many cases ingress data units are also processed by applying various manipulations such as editing packet headers, adding headers, removing headers and the like.

On-chip memory is typically too small to store large sized packet queues and thus off chip memory (usually DDR) is used to store the data queues.

Managing the off-chip memory is a complex task due to the high rate of incoming and outgoing packets, and the need to manage a large number of queues. As a result, memory switch architectures are built around a single frame structure. If incoming or outgoing data is formatted according to another format then the memory switch has to convert this other format to the single frame structure. For example, an Ethernet switch can have an ATM interface through which Ethernet frames arrive fragmented into cells; the cells are reassembled to an Ethernet frame at the input port on the chip or through additional external memory access before been stored in the adequate queue. This translation hardware (the reassembly hardware in the example above) requires a large memory, increases the chip costs, and reduced the operation rate or the number of supported ports or queues.

In addition, prior art devices used to perform multiple memory accesses in order to perform protocol interworking and processing and then send the processed data units to queues. Using smaller queues can increase the memory allocation efficiency but on the other hand using a large number of buffers requires a large number of pointers to these buffers. Free buffers are pointed by free buffers. The management of large number of free buffer pointer further complicates memory management and storing a free buffer list at a dedicated storage unit further increases the cost of memory management.

In addition, various memory unit management, such as DDR memory management, is characterized by low utilization.

There is a growing need to provide efficient devices and method for storing and processing high bandwidth, high capacity, multi queues data packets.

SUMMARY OF THE INVENTION

A device for storing and processing data units, the device includes: a data processor; and a DDR controller, adapted to be coupled to a double data rate (DDR) memory unit DDR memory unit; wherein the DDR controller includes: a read request dual port random access (DPR) memory unit, adapted to store requests to read data from the DDR memory unit; a write request DRP memory unit adapted to store requests to read data from the DDR memory unit; and a selection unit adapted to select a stored request to be sent to the DDR memory unit; wherein the device is adapted to store an ingress data unit at the DDR memory unit before the data processor processes a fetched data unit from the DDR memory unit to provide an egress data unit; and wherein the fetched data unit comprises at least a portion of the ingress data unit.

A method for storing and processing data units, the method includes: storing, at a read request dual port random access (DPR) memory unit, at least one request to read data from a double data rate (DDR) memory unit; storing, at a write request dual port random access (DPR) memory unit, at least one request to write data to a double data rate (DDR) memory unit; selecting a stored request to be sent to the DDR memory unit; wherein if the selected stored request is a write request, storing an ingress data unit at the DDR memory unit; retrieving a fetched data unit from the DDR memory unit and processing the fetched data unit to provide an egress data unit; wherein the fetched data unit comprises at least a portion of the ingress data unit.

BRIEF DESCRIPTION OF THE DRAWINGS

The invention is herein described, by way of example only, with reference to the accompanying drawings, wherein.

DETAILED DESCRIPTION

A method and device for storing and processing data units are provided.

The device and method uses a single memory access instead of multiple memory accesses. Instead of performing one or more memory access (including using input queues and output queues), performing protocol interworking and processing and finally storing the processed data units in queues, the method and device fetch, prior to a transmission of an egress data unit, a fetched data unit from a DDR memory unit and process (by applying both protocol interworking and processing) it to provide an egress data unit.

The device and method can manage data units of variable sizes. The device and method are adapted to receive an ingress data unit, to store the ingress data unit at (a DDR memory unit, to fetch a fetched data unit to a data processor, and to process the fetched data unit to provide an egress data unit. The ingress data unit, fetched data unit and egress data unit can differ from each other but they share at least some data bits. For example, a fetched data unit can include only a portion of the ingress data unit. On the other hand a fetched data unit can include more than a single ingress data unit.

Conveniently, the data units within the DDR memory unit are arranged in queues and one or more queues can be allocated per one or more destination.

Each of the mentioned above data units can be a frame, a frame segment and the like. Typically, the size of each of these data units is responsive to the communication protocol of that data unit. There are communication protocols that define variable size data units while other communication protocols define fixed size data units and access towards the DDR memory unit can be done by each protocol with different sized fetched data units. The device and method can manage ingress data units and egress data units of different sizes and of different types (different communication protocols).

Conveniently, an egress data unit is sent to the DDR memory unit before being processed. The processing is executed after fetching data stored in the DDR memory unit.

The processing is done on-the-fly, and can include SAR, inverse multiplexing or header manipulation operations.

Figure 1:
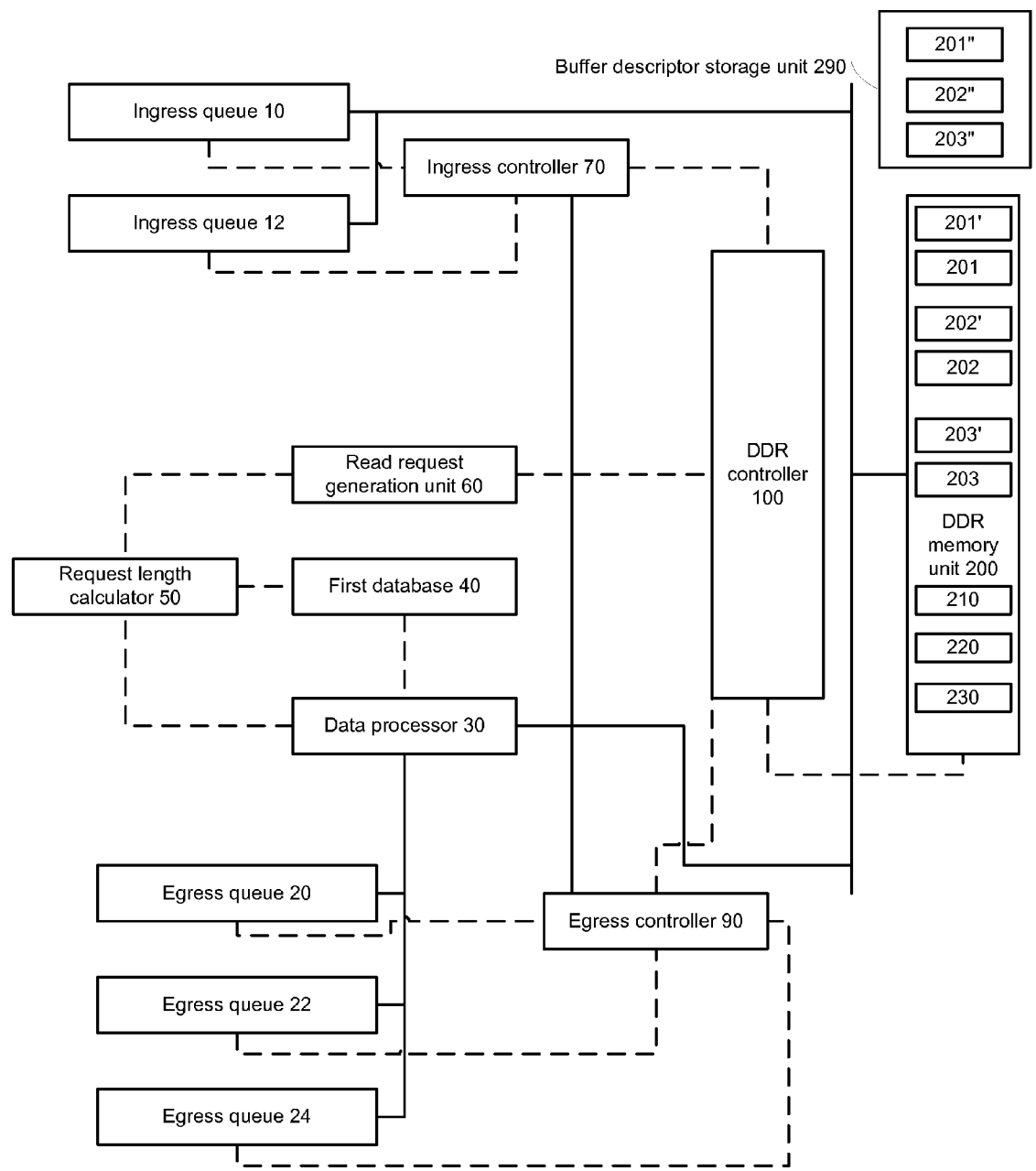
FIG. 1 illustrates a device according to an embodiment of the invention.

FIG. 1 illustrates device 10 according to an embodiment of the invention.

Device 10 includes multiple ingress queues (such as ingress queues 10 and 12), multiple egress queues (such as egress queues 20-24), data processor 30, first database 40, read request generation unit 60, Tingress controller 70, egress controller 90, DDR controller 100 and request length calculator 50.

Device 10 can include DDR memory unit 200 or can be connected to DDR memory unit 200. FIG. 1 illustrates device 10 as including DDR memory unit 200.

The various components illustrated in FIG. 1 can be connected to each other to provide data paths as well as control paths. Ingress controller 70 is connected to DDR controller 100 and to ingress queues 10 and 12 such as to define an ingress control path. Ingress queues 10 and 12 are connected to DDR memory unit 200 to define an ingress data path. Egress controller 90 is connected to egress queues 20, 22 and 24, to DDR controller 100 and also to ingress controller 70.

Data processor 30 is connected to egress queues 20-24 and also connected to DDR memory unit 200 to define an egress data path. Data processor 30 is also connected to request length calculator 50 and first data base 40. Request length calculator 50 is connected to read request generation unit 60. Read request generation unit 60 is connected to DDR controller 100. DDR controller 100 is connected to DDR memory unit 200.

Ingress queues 10 and 12 store received ingress data units. These ingress queues are controlled by ingress controller 70. Ingress controller 70 monitors these ingress queues and sends write requests to DDR controller 100 in response to a reception of an ingress data unit. To save memory space ingress controller 70 can generate a request to write parts of a received frame before the entire frames is received at ingress queue 10. Egress queues 20-24 store egress data units provided by data processor 30.

Device 10 also includes multiple input ports and multiple output ports. Various mapping between these ports and the mentioned above queues can be utilized without departing from the scope of the invention. It is noted that different egress queues can store egress data units of different lengths as well as of different formats.

First database 40 stores at least one fetch rule and at least one process rules. A fetch rule can indicate the size of the fetch data unit. This size can be determined by the type of the fetched data unit. For example, if an egress data unit is an ATM compliant data unit (and can be eventually outputted from device 10 via an ATM output port) then the fetched data unit can include forty eight bytes and the egress data unit will eventually include fifty three bytes. If an AAL header is required the data payload is further decreased as the AAL header is regarded as part of the forty eight byte payload.

It is noted that first database 40 can also store various processing rules such as header manipulations, header generations, and the like. It is further notes that the size of the fetched data unit can be responsive to the processing operations executed by data processor 30. It is noted that segmentation and reassembly can be regarded as data processing operations executed by data processor 30.

Read request generation unit 60 can determine that a fetch data unit should be retrieved from DDR memory unit 200. It (or request length calculator 50) then accesses first data base 40 and retrieves a fetch rule indicative of a size of fetched data unit. It then sends to DDR controller 100 a request to read a fetched data unit from data processor 30. The request can also include the priority (so called initial priority) of the fetched data unit. The initial priority can be stored at first database 40. It is termed an initial priority because device 10 can updated the priority of read requests in response to the pending period of the read request. This time based priority update assists in preventing a starvation of lower priority read requests. The initial priority of a read request can be responsive (for example proportional) to a transmission rate of a certain output port.

Conveniently, data is stored at DDR memory unit 200 at buffers. Each buffer is associated with a buffer descriptor and a pointer. Buffer descriptors can be arranged in rings or groups. According to an embodiment of the invention buffer descriptors are stored at buffer descriptor storage unit 290. The DDR memory unit 200 stores pairs of pointers. One pointer points to a buffer while the other points to its associated buffer descriptor.

Referring to FIG. 1, a first pair of pointers 201 and 201' point to buffer 210 and to its buffer descriptor 201". A second pair of pointers 202 and 202' point to buffer 220 and to its buffer descriptor 202". A third pair of pointers 203 and 203' point to buffer 230 and to its buffer descriptor 203".

Yet according to another embodiment of the invention egress controller 70 and egress controller 90 receive information about available buffers. Available buffers are represented by the location of their pointers. Egress controller and ingress controller share available pointer information.

According to an embodiment of the invention the ingress controller 70 and the egress controller 90 can share information relating to free pointers without involving DDR memory unit 200. This is referred to as available pointers bypass.

According to an embodiment of the invention the available pointers bypass mechanism includes sending available pointer information is sent from egress controller 90 to ingress controller 70. It is noted that this operation can be preceded by checking if the ingress controller 70 has enough available space to store the available pointer information. Available pointes are then used to indicate where new data can be stored. Conveniently, the ingress controller 70 is aware of the memory banks (of DDR memory unit 200) that is associated with the available pointer. Thus, load balancing between the different memory banks can be achieved.

According to an embodiment of the invention the available pointers bypass is performed during idle period in which data is not written to DDR memory unit 200 without loosing the DDR bandwidth.

Figure 2:
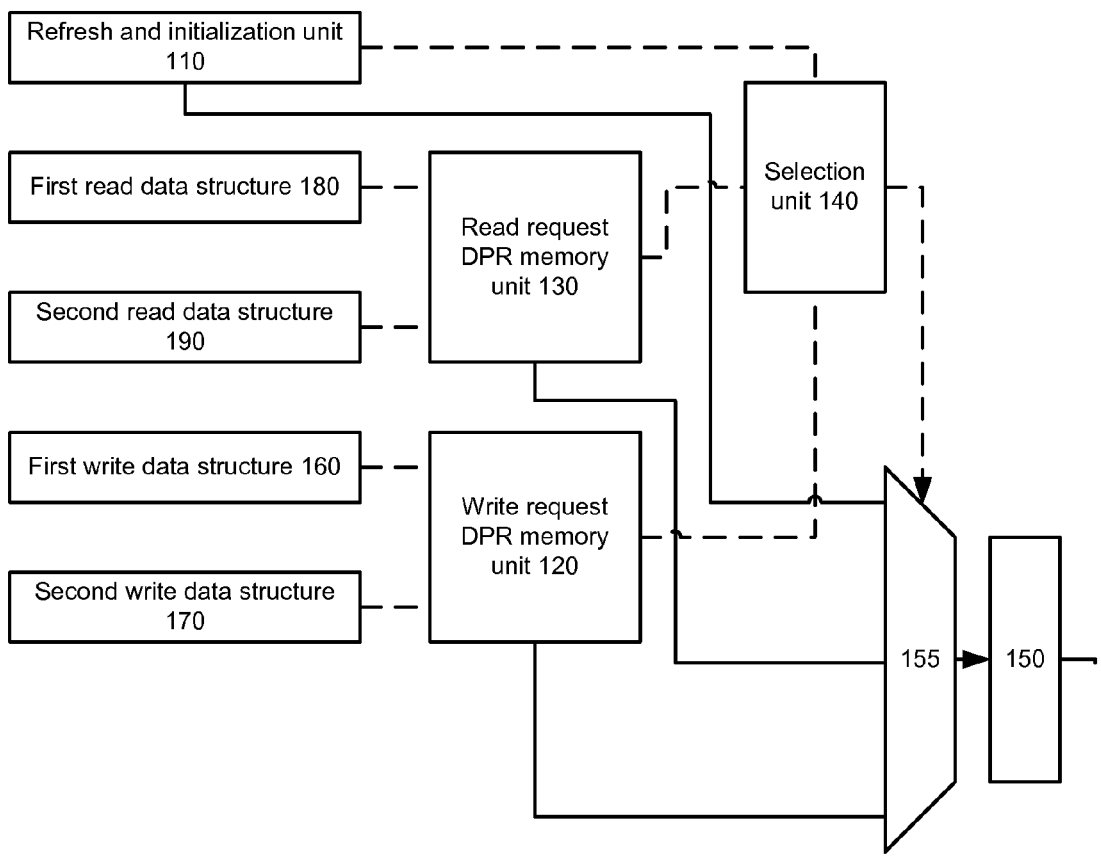
FIG. 2 illustrates a DDR controller according to another embodiment of the invention.

FIG. 2 illustrates DDR controller 100 according to an embodiment of the invention.

DDR controller 100 includes: (i) read request dual port random access (DPR) memory unit 130, adapted to store requests to read data from the DDR memory unit, (ii) write request DRP memory unit 120 adapted to store requests to read data from the DDR memory unit; (iii) refresh and initialization unit 110 adapted to generate refresh operation requests, (iv) selection unit 140 adapted to select a stored request to be sent to the DDR memory unit; (v) first read data structure 160 indicative of pending valid read requests stored in the read request DPR memory unit; (vi) second read data structure 170 indicative of valid read requests that were executed; (vii) first write data structure 180 indicative of pending valid write requests stored in the write request DPR memory unit; (viii) second write data structure 190 indicative of valid write requests that were executed; and (ix) sequencer 150 adapted to receive a selected request and time the provision of that request to DDR memory unit 200.

Selection unit 140 sends selection signals to a selected components out of read request DPR memory unit 130, write request DRP memory unit 120 and refresh and initialization unit 110 and the selected device sends a request to sequencer 150. This is illustrated in FIG. 2 by multiple control signals between components 110-140 as well as multiplexer 155 that is connected to components 110-130.

Selection unit 140 can select a request as well as a target DDR memory unit bank (out of multiple DDR memory banks within DDR memory unit 200) in response to various selection rules as well as in response to a combination of various selection rules. Various selections rules are illustrated in greater detail in relation to FIG. 3. Nevertheless some of the selection rules include: (i) Selecting a stored request out of multiple stored requests (stored within read request DPR memory unit 130, write request DPR memory unit 120, refresh and initialization unit 110) in response to initial priorities of the multiple stored requests and in response to pending periods of the multiple stored requests; (ii) Selecting a stored request in response to initial priorities of the multiple stored requests and in response to a type of at least one previously selected stored request; wherein the type can include a read request or a write request; (iii) Selecting a target memory bank (memory bank in which at least a portion of the ingress data unit is to be written) in response to the sequence of memory banks that were accessed during previous access cycles (the sequence length can be one, two, or three); (iv) Selecting a target memory bank in response to an amount of pending requests and especially preferring memory banks that have more pending requests.

Conveniently, the number of pending requests per memory per bank is represented by multiple bits. The inventors used two bits to indicate whether the number of pending requests per memory bank is above or below a certain threshold. The threshold was set to three pending requests but other thresholds can be set.

According to an embodiment of the invention read request DPR 130 can also store fetched data units and write request DPR 120 also stores ingress data units. A fetched data unit can overrun the read request that caused it to be fetched, but this is not necessarily so. Second read data structure 170 can indicate that a certain read request was executed when the fetched data unit that was retrieved in response to that read request is stored at read request DPR 130.

Conveniently, DDR memory unit 200 stores data and data descriptors. The data descriptors can be stored in linked queues while each data descriptor points to a certain ingress data unit, a portion of an ingress data unit of multiple ingress data units.

According to an embodiment of the invention device 10 can manipulate and read data structures 160, 170, 180, and 190 to communicate with the DDR controller 100 the fullness of entries of the DPR memory units 130 and 120.

To avoid a situation that due to a delayed write operation a read request for the same data is attempted the invention use the following mechanism. Device 10 is adapted to update an internal data structure only after a completion of a storage process of an ingress data unit and associated metadata; until this update there is no indication of the availability of the data to the device and hence a read request cannot be issued. For example if a certain ingress data unit and associated metadata should be stored in DDR memory entries X0-X9 then only after these entries are filled the appropriate bits in first DDR control data structure 230 will be updated to indicate that they are full. Thus, device 10 is adapted to complete a storage of an ingress data unit and ingress data unit metadata within at least one DDR memory unit entry and after a completion of the storage to update first DDR control data structure 230 to indicate that the at least one DDR memory unit entry is full.

The following example illustrates in greater detail the selection of a request as well as a selection of a target memory bank. It is assumed that: (i) a block of data can be written to the DDR memory unit 200 during an uninterrupted write cycle; (ii) DDR memory unit includes four memory banks— bank a 210, bank b 215, bank c 220 and bank d 225.

Read request DPR memory unit 130 provides to selection unit 140 the following input signals: (i) $r_i$bl (i=0,1,2,3)—The number of read requests for block i. If the number of read requests for block i is greater than three then $r_i c=3$. (ii) $r_i p$ (i=0,1,2,3)—the highest priority of a read request to bank i. In the following embodiment example there are only two priority levels: 0 (regular) and 1 (high).

Write request DPR memory unit 120 provides to selection unit 140 the following input signals: (i) $w_i$bl (i=0,1,2,3)—The number of write requests for block i. If the number of write requests for block i is great than three then $r_i$bl=3. (ii) $w_i p$ (i=0,1,2,3)—the highest priority of a write request to bank i. In the following embodiment example there are only two priority levels: 0 (regular) and 1 (high).

Sequencer 150 provides to selection unit 140 the following input signals:
  (i) last_op—the last operation performed, either read or write;
  (ii) last_bank—the memory bank where the last operation was performed, wherein last_bank can equal wherein a, b, c, or d;
  (iii) last_long—this input variable equals one if the last operation is writing more than a predefined number (for example six) words or reading more than a predefined number (for example five) words;
  (iv) penult_op—the penultimate operation performed, either read or write;
  (v) penult_bank—the memory bank where the penultimate operation was performed, wherein penult_bank can equal a, b, c, or d.

It is noted that selection unit 140 maintains a counter op_count for the number of consecutive operations of the same kind (read or write) performed.

The concatenation of the $r_i p$ and $r_i$bl signals is termed general priority and is denoted gen_$pr_i$. For example, if $r_i$bl=2 and $r_i p$=1 then gen_$pr_i$=$110_2$=6, or if $r_i$ bl=3 and $r_i p$=0 then gen_$pr_i$=$011_2$=3.

For simplicity of explanation it is assumed that penult_bank=a, last_bank=b, and the other two banks are c and d. Pairs of selected request and target memory bank will be represented by (selected request, target memory bank).

If last_op=penult_op AND op_count<op_cnt_max then the selected request and target memory bank are selected according to the following order:
  (I) (last_op, c), if gen_$pr_c$≧gen_$pr_d$, else (last_op,d),
  (II) if last_long select (last_op, a);
  (III) (last_op', c) if gen_$pr_c$≧gen_$pr_d$, else (lasp_op', d);
  (IV) (last_op', a);
  (V) (last_op, a);
  (VI) (write,b); and finally
  (VII) (read, b).

If last_op=penult_op AND op_count=op_cnt_max then the selected request and target memory bank are selected according to the following order:
  (I) (last_op', c) if gen_$pr_c$≧gen_$pr_d$, else select (last_op', d);
  (II) (last_op', a); and (III) (last_op', b).

If penult_op=read AND last$_{13}$ op=write then the selected request and target memory bank are selected according to the following order:

(I) (write, c) if gen_pr$_c$≧gen_pr$_d$, else (write, d);
(II) (read, c) if gen_pr$_c$≧gen_pr$_d$, else (read, d);
(III) (write, a); (IV) (read, a);
(V) (write, b); and finally
(VI) (read, b).

If penult_op=write AND last_op=read then the selected request and target memory bank are selected according to the following order:

(I) (read, c) if gen_pr$_c$≧gen_pr$_d$, else (read, d);
(II) (write, c), if gen_pr$_c$≧gen_pr$_d$, else (write, d);
(III) (write, a);
(IV) (read, a);
(V) (write, b); and finally
(VI) (read, b).

According to an embodiment of the invention DDR controller 100 is adapted to receive a request to write to the DDR memory unit (K+L) bits of data (wherein K bits of data are referred to as a block of data and can be written during a single (uninterrupted) write cycle of the DDR memory unit and wherein L is a positive integer that is smaller than K) and in response to initiate a first write cycle and a second write cycle, wherein the second write cycle is started after L bits were written and before the first write cycle is completed. Assuming, for example that 8 bytes of data can be written to DDR memory unit 200 per a single write cycle that includes four clock cycles. Yet assuming that a request to write 10 bytes of data are provided to DDR controller 100. DDR controller 100 will not write the first eight bytes (during four clock cycles) and then initiate another write cycle (of four clock cycles) during which the remaining two bytes will be written. Instead, DDR controller 100 will start by writing the first two bytes and immediately after they are written (before a completion of the four clock cycle long first write cycle) will start a second write cycle during which the remaining eight bytes will be written to DDR memory 200.

According to an embodiment of the invention the DDR controller 100 is adapted to receive a request to write an ingress data unit to an address (within DDR memory unit 200) that is offset from a beginning of a DDR memory unit entry. In response, DDR controller 100 is adapted to initiate a first write cycle and a second write cycle. The second write cycle is initiated after the DDR memory unit entry is filled (during the first write cycle) and before the first write cycle is completed.

Figure 3:
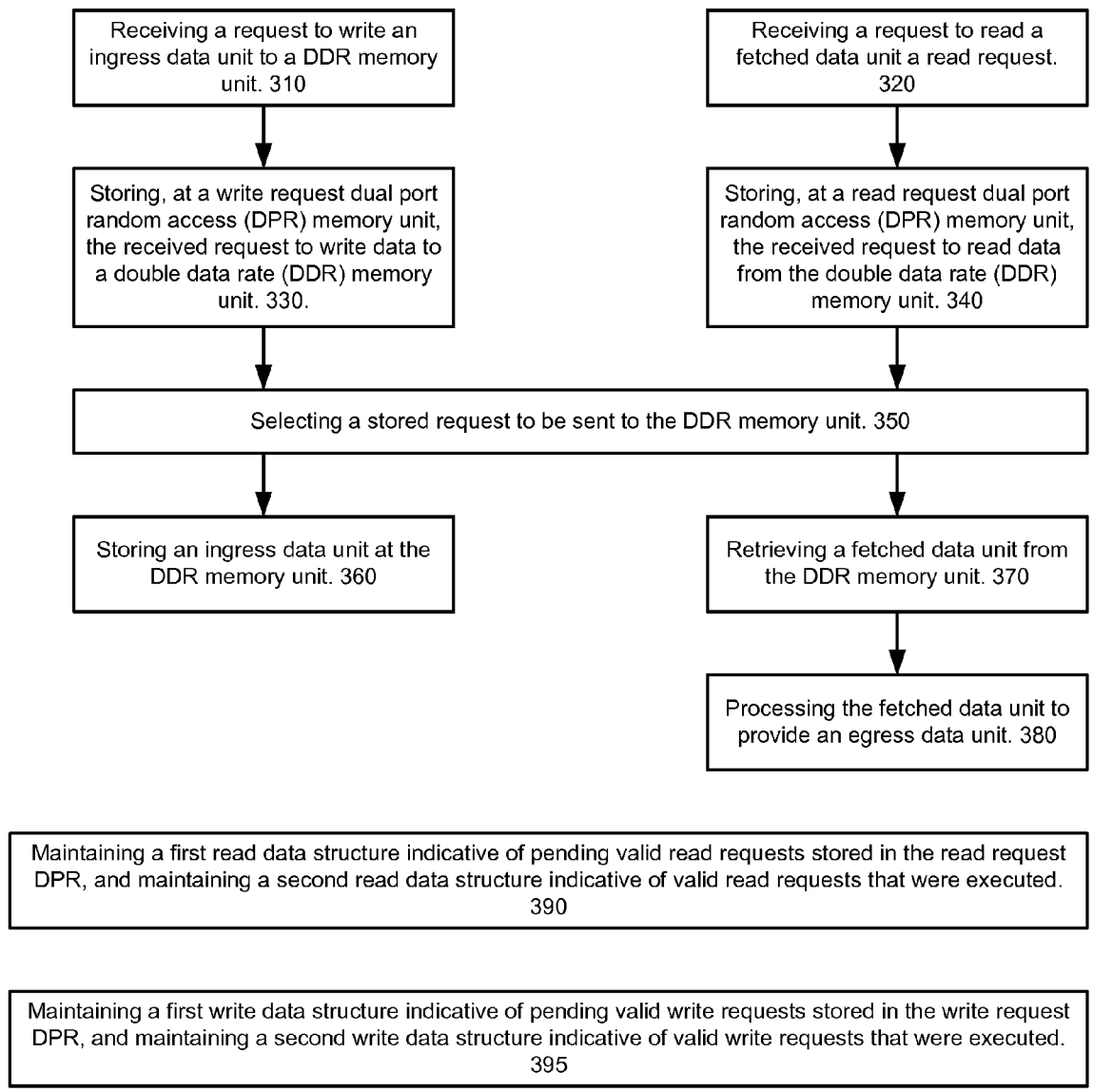
FIG. 3 is a flow chart of a method for storing and processing data units according to an embodiment of the invention.

FIG. 3 illustrates a method 300 for storing and processing data units, according to an embodiment of the invention.

Method 300 starts by stages 310 and 320. Stage 310 includes receiving a request to write an ingress data unit to a DDR memory unit. Referring to the example set fourth in previous figures, an ingress data unit is received in an ingress queue, ingress controller 70 generates a write request to DDR controller 100. DDR controller 100 receives the read request. Stage 310 may include receiving at an ingress queue an ingress data unit. The reception is followed by providing to a DDR controller a request to write an ingress data unit to the DDR memory unit.

Stage 320 includes receiving a request to read a fetched data unit a read request.

Referring to the example set fourth in previous figures, read request generation unit 60 generates a read request. DDR controller 100 receives the read request. It is noted that typically a write request precedes a read request. It is further noted that various stages relating to the write process can be executed independently from stage relating to a read process.

Stage 310 is followed by stage 330 storing, at a write request dual port random access (DPR) memory unit, the received request to write data to a double data rate (DDR) memory unit. This request will be referred to as a write request. Referring to the example set fourth in previous figures, write request DPR memory unit 120 within DDR controller 100 stores the write request.

Stage 320 is followed by stage 340 of storing, at a read request dual port random access (DPR) memory unit, the received request to read data from the double data rate (DDR) memory unit. This request will be referred to as a read request. Referring to the example set fourth in previous figures, read request DPR memory unit 130 within DDR controller 100 stores the read request.

It is noted that stages 310 and 330 as well as stages 320 and 340 can be repeated during the execution of other stages of method 300.

Stages 330 and 340 are followed by stage 350 of selecting a stored request to be sent to the DDR memory unit. Referring to the example set fourth in previous figures, selection unit 140 can select a request out of a refresh request stored within refresh and initialization unit 110, a read request stored within read request DRP memory unit 130, write request DPR memory unit 120. The selected request is sent, via multiplexer 155 to sequencer 150.

Conveniently, stage 350 of selecting includes selecting a stored request out of multiple stored requests in response to initial priorities of the multiple stored requests and in response to pending periods of the multiple stored requests.

Conveniently, stage 350 of selecting includes selecting a stored request in response to initial priorities of the multiple stored requests and in response to a type of at least one previously selected stored request.

Conveniently, stage 350 of selecting includes selecting a memory bank out of multiple memory banks of the DDR memory unit in which at least a portion of the ingress data unit is to be written in response to at least one memory bank that was accessed during previous access cycles.

If the selected stored request is a write request, then stage 350 is followed by stage 360 of storing an ingress data unit at the DDR memory unit.

Conveniently, stage 360 includes completing a storage of an ingress data unit and ingress data unit metadata within at least one DDR memory unit entry; and updating, after a completion of the storage, a first DDR control data structure indicative of a fullness of entries of the DDR memory unit to indicate that the at least one DDR memory unit entry is full.

Conveniently, stage 310 includes receiving a request to write to the DDR memory unit (K+L) bits of data; wherein K bits of data are written during a single write cycle of the DDR memory unit; wherein L is a positive integer that is smaller than K. Stage 360 includes initiating a first write cycle and a second write cycle; wherein the second write cycle is initiated after L bits were written and before the first write cycle is completed.

Conveniently, stage 310 includes receiving a request to write an ingress data unit to an address that is offset from a beginning of a DDR memory unit entry. Stage 360 includes initiating a first write cycle and a second write cycle; wherein the second write cycle is initiated after the DDR memory unit entry is filled and before the first write cycle is completed.

If the selected request is a write request then stage 350 is followed by stage 370 of retrieving a fetched data unit from the DDR memory unit. Referring to the example set forth in previous drawings, a fetched data unit from DDR memory unit 200 can be temporarily stores at read request DPR memory unit 130. It any case it is stored in a memory unit or storage circuit that is accessible by data processor 30. It can also be stored in data processor 30.

Conveniently, stage 370 includes retrieving a fetch rule indicative of a size of fetched data unit from a first database and then fetching the fetch data unit from the DDR memory unit in response to the retrieved fetch rule.

Stage 370 is followed by stage 380 of processing the fetched data unit to provide an egress data unit. The fetched data unit comprises at least a portion of the ingress data unit. Referring to the example set forth in previous drawings, data processor 30 processes the fetched data unit to provide an egress data unit.

Conveniently, method 300 includes stage 390 of maintaining a first read data structure indicative of pending valid read requests stored in the read request DPR; and maintaining a second read data structure indicative of valid read requests that were executed. Referring to the example set forth in previous drawings, stage 390 includes maintaining first read data structure 160 and second read data structure 170.

Conveniently, method 300 includes stage 395 of maintaining a first write data structure indicative of pending valid write requests stored in the write request DPR; and maintaining a second write data structure indicative of valid write requests that were executed. Referring to the example set forth in previous drawings, stage 390 includes maintaining first write data structure 180 and second write data structure 190.

While the invention has been described with respect to a limited number of embodiments, it will be appreciated that many variations, modifications and other applications of the invention may be made.

What is claimed is:

1. A device for storing and processing data units, the device comprises:
    a data processor; and
    a DDR controller, adapted to be coupled to a double data rate (DDR) memory unit DDR memory unit; wherein the DDR controller comprises:
        a read request dual port random access (DPR) memory unit, adapted to store requests to read data from the DDR memory unit;
        a write request DRP memory unit adapted to store requests to read data from the DDR memory unit; and
        and a selection unit adapted to select a stored request to be sent to the DDR memory unit;
    wherein the device is adapted to store an ingress data unit at the DDR memory unit before the data processor processes a fetched data unit from the DDR memory unit to provide an egress data unit; and wherein the fetched data unit comprises at least a portion of the ingress data unit.

2. The device according to claim 1 further comprising a read request generation unit and a first database; wherein the first database stores at least one fetch rule and at least one process rules; wherein the read request unit is adapted to retrieve a fetch rule indicative of a size of fetched data unit from the first database and provide to the data processor the fetched data unit in response to the retrieved fetch rule.

3. The device according to claim 1 wherein the DDR controller comprises:
    a first read data structure indicative of pending valid read requests stored in the read request DPR; and
    a second read data structure indicative of valid read requests that were executed.

4. The device according to claim 1 wherein the DDR controller comprises:
    a first write data structure indicative of pending valid write requests stored in the write request DPR; and
    a second write data structure indicative of valid write requests that were executed.

5. The device according to claim 1 wherein the selection unit is adapted to select a stored request out of multiple stored requests in response to initial priorities of the multiple stored requests and in response to pending periods of the multiple stored requests.

6. The device according to claim 1 wherein the selection unit is adapted to select a stored request in response to initial priorities of the multiple stored requests and in response to a type of at least one previously selected stored request.

7. The device according to claim 1 wherein DDR memory unit comprises multiple memory banks and wherein the selection unit is adapted to select a memory bank in which at least a portion of the ingress data unit is to be written in response to at least one memory bank that was accessed during previous access cycles.

8. The device according to claim 1 further comprising a first DDR control data structure indicative of a fullness of entries of the DDR memory unit; wherein the device is adapted to complete a storage of an ingress data unit and ingress data unit metadata within at least one DDR memory unit entry and after a completion of the storage to update the first DDR control data structure to indicate that the at least one DDR memory unit entry is full.

9. The device according to claim 1 wherein the DDR controller is adapted to receive a request to write to the DDR memory unit (K+L) bits of data; wherein K bits of data are written during a single write cycle of the DDR memory unit; wherein L is a positive integer that is smaller than K; wherein the DDR controller is adapted to initiate a first write cycle and a second write cycle; wherein the second write cycle is started after L bits were written and before the first write cycle is completed.

10. The device according to claim 1 wherein the DDR controller is adapted to receive a request to write to an address that is offset from a beginning of a DDR memory unit entry an ingress data unit; wherein the DDR controller is adapted to initiate a first write cycle and a second write cycle; wherein the second write cycle is initiated after the DDR memory unit entry is filled and before the first write cycle is completed.

11. The device according to claim 1 wherein the data processor is adapted to perform protocol inter-working.

12. The device according to claim 1 wherein the DDR memory unit stores multiple buffers and multiple pairs of buffers, wherein a first pointer of a pair of pointers points to a buffer while a second pointer of the pair of buffers points to a buffer descriptor associated with the buffer.

13. The device according to claim 1 further adapted to send available pointer information while bypassing the DDR memory unit.

14. A method for storing and processing data units, the method comprises:
    storing, at a read request dual port random access (DPR) memory unit, at least one request to read data from a double data rate (DDR) memory unit;
    storing, at a write request dual port random access (DPR) memory unit, at least one request to write data to a double data rate (DDR) memory unit;
    selecting a stored request to be sent to the DDR memory unit; wherein if the selected stored request is a write request, storing an ingress data unit at the DDR memory unit;
    retrieving a fetched data unit from the DDR memory unit and processing the fetched data unit to provide an egress data unit; wherein the fetched data unit comprises at least a portion of the ingress data unit.

15. The method according to claim 14 further comprising retrieving a fetch rule indicative of a size of fetched data unit from a first database and fetching the fetch data unit from the DDR memory unit in response to the retrieved fetch rule.

16. The method according to claim 14 further comprising maintaining a first read data structure indicative of pending valid read requests stored in the read request DPR; and maintaining a second read data structure indicative of valid read requests that were executed.

17. The method according to claim 14 further comprises maintaining a first write data structure indicative of pending valid write requests stored in the write request DPR; and maintaining a second write data structure indicative of valid write requests that were executed.

18. The method according to claim 14 wherein the selecting comprises selecting a stored request out of multiple stored requests in response to initial priorities of the multiple stored requests and in response to pending periods of the multiple stored requests.

19. The method according to claim 14 wherein the selecting comprises selecting a stored request in response to initial priorities of the multiple stored requests and in response to a type of at least one previously selected stored request.

20. The method according to claim 14 wherein the selecting comprises selecting a memory bank out of multiple memory banks of the DDR memory unit in which at least a portion of the ingress data unit is to be written in response to at least one memory bank that was accessed during previous access cycles.

21. The method according to claim 14 further comprising completing a storage of an ingress data unit and ingress data unit metadata within at least one DDR memory unit entry; and updating, after a completion of the storage, a first DDR control data structure indicative of a fullness of entries of the DDR memory unit to indicate that the at least one DDR memory unit entry is full.

22. The method according to claim 14, wherein the method comprises:
receiving a request to write to the DDR memory unit (K+L) bits of data; wherein K bits of data are written during a single write cycle of the DDR memory unit; wherein L is a positive integer that is smaller than K; and
initiating a first write cycle and a second write cycle; wherein the second write cycle is initiated after L bits were written and before the first write cycle is completed.

23. The method according to claim 14 wherein the method comprises:
receiving a request to write an ingress data unit to an address that is offset from a beginning of a DDR memory unit entry; and initiating a first write cycle and a second write cycle; wherein the second write cycle is initiated after the DDR memory unit entry is filled and before the first write cycle is completed.

24. The method according to claim 14 wherein the processing comprises protocol inter-working.

25. The method according to claim 14 wherein the retrieving comprises reading a pair of pointers associated with a buffer stored at the DDR memory bank, wherein a first pointer of a pair of pointers points to a buffer while a second pointer of the pair of buffers points to a buffer descriptor associated with the buffer.

26. The method according to claim 14 further comprising sending available pointer information while bypassing the DDR memory unit.

* * * * *